(12) United States Patent
Chen et al.

(10) Patent No.: US 9,875,983 B2
(45) Date of Patent: Jan. 23, 2018

(54) NANOMICROCRYSTALLITE PASTE FOR PRESSURELESS SINTERING

(71) Applicant: Indium Corporation, Clinton, NY (US)

(72) Inventors: Sihai Chen, New Hartford, NY (US); Ning-Cheng Lee, New Hartford, NY (US)

(73) Assignee: Indium Corporation, Utica, NY (US)

( * ) Notice: Subject to any disclaimer, the term of this patent is extended or adjusted under 35 U.S.C. 154(b) by 0 days.

(21) Appl. No.: 15/142,263

(22) Filed: Apr. 29, 2016

(65) Prior Publication Data

US 2017/0317046 A1     Nov. 2, 2017

(51) Int. Cl.
*H01L 29/40* (2006.01)
*H01L 23/00* (2006.01)

(52) U.S. Cl.
CPC .............. *H01L 24/29* (2013.01); *H01L 24/27* (2013.01); *H01L 24/83* (2013.01); *H01L 2224/27013* (2013.01); *H01L 2224/2732* (2013.01); *H01L 2224/29139* (2013.01); *H01L 2224/29144* (2013.01); *H01L 2224/29147* (2013.01); *H01L 2224/29164* (2013.01); *H01L 2224/29169* (2013.01); *H01L 2224/29173* (2013.01); *H01L 2224/29176* (2013.01); *H01L 2224/29178* (2013.01); *H01L 2224/29563* (2013.01); *H01L 2224/8302* (2013.01); *H01L 2224/8384* (2013.01); *H01L 2224/83095* (2013.01)

(58) Field of Classification Search
CPC ......... H01L 24/29; H01L 24/27; H01L 24/83; H01L 2224/27013; H01L 2224/2732; H01L 2224/29139; H01L 2224/29144; H01L 2224/29147; H01L 2224/29164; H01L 2224/29169; H01L 2224/29173; H01L 2224/29176; H01L 2224/29178; H01L 2224/29563; H01L 2224/8302; H01L 2224/83095; H01L 2224/8384
See application file for complete search history.

(56) References Cited

U.S. PATENT DOCUMENTS

| 2013/0001775 A1* | 1/2013 | Nishikubo | H01L 24/13 257/737 |
| 2014/0234649 A1* | 8/2014 | Kalich | C23C 26/00 428/551 |
| 2016/0351529 A1* | 12/2016 | Brunschwiler | H01L 24/81 |

* cited by examiner

*Primary Examiner* — Victor A Mandala
*Assistant Examiner* — Colleen E Snow
(74) *Attorney, Agent, or Firm* — Sheppard Mullin; Daniel Yannuzzi; Jonathan Marina

(57) ABSTRACT

A sintering paste includes solvent and nanomicrocrystallite (NMC) particles. Each NMC particle is a single crystallite having at least one dimension in the range of 1 nm to 100 nm and at least one dimension in the range of 0.1 µm to 1000 µm. The sintering paste may be used in a pressureless sintering process to form a low porosity joint having high bond strength, high electrical and thermal conductivity, and high thermal stability.

20 Claims, 8 Drawing Sheets

NANOMICROCRYSTALLITE PASTE FOR PRESSURELESS SINTERING

TECHNICAL FIELD

The disclosed technology relates generally to sintering technology, and more particularly, some embodiments relate to sintering pastes including nanomicrocrystallite.

DESCRIPTION OF THE RELATED ART

Die attachment is a well-known process of bonding a die containing an integrated circuit to a substrate, package, or another die in the formation of electronic devices. High temperature electronics require die attaches that have a high melting point. Conventionally, high-lead, high melting temperature solders were used for bonding high temperature electronic devices. However, due to increasing requirements for higher service and operating temperatures, and higher thermal and electrical conductivity, suitable for next generation high power devices such as insulated-gate bipolar transistors (IGBT), high-lead solder materials are reaching a performance limitation. Moreover, due to increasing environmental concern and regulation over the use of high-lead solder material in the electronics fields, alternatives to high-lead solder materials have been sought.

Conductive adhesives have been used as bonding material in pastes for die attachment. The adhesives normally contain metal flakes, such as silver (Ag) flakes, that provide electrical and thermal conductivity, and epoxy materials that provide adhesion between the die and substrate. In the application of high power, high temperature and high reliability devices, however, conductive adhesives are not good candidates. The polymeric binder of these adhesives is a poor thermal and electrical conductor, and is instable at high temperatures. Accordingly, the polymeric binder of the conductive paste has to be removed in order to achieve high thermal and electrical conductivity and good stability at high service temperatures.

More recently, the sintering of pastes under high pressures (tens of MPa) to form highly reliable joints has been used in die-attach applications requiring high temperatures. However, the application of high pressure (tens of MPa) during sintering requires expensive, specialized tooling that inevitably lowers throughput. Additionally, the high pressure applied during sintering causes cracking of brittle dies, further lowering the yield of such processes. If pressure is reduced, the reduction in pressure comes at the cost of higher porosity and lower joint bond strength, which results in a joint having poor reliability, and poor electrical and thermal conductivity.

BRIEF SUMMARY OF EMBODIMENTS

The present disclosure describes a sintering paste containing nanomicrocrystallite and solvent. In various embodiments, the sintering paste may be sintered without applying external pressure to form a low porosity joint with high bond strength.

As used herein to refer to a particle dimension, a dimension "N" refers to a size range from 1 nm to 100 nm, and a dimension "M" refers to a size range of 0.1 µm to 1000 µm. As used herein to refer to a particle, the term "aspect ratio" refers to the ratio of the largest diameter and smallest diameter orthogonal to it.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the included figures. The drawings are provided for purposes of illustration only and merely depict typical or example embodiments of the disclosed technology. These drawings are provided to facilitate the reader's understanding of the disclosed technology and shall not be considered limiting of the breadth, scope, or applicability thereof. It should be noted that for clarity and ease of illustration these drawings are not necessarily made to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

As noted above, current sintering pastes used in the market inadequately address the following joint requirements: pressureless sintering bonding, low joint porosity, and high joint reliability. In accordance with embodiments of the technology disclosed herein, a sintering paste including nanomicrocrystallite particles may be sintered without applying external pressure to form a low porosity joint having high bond strength, high electrical and thermal conductivity, and high thermal stability.

In various embodiments, the disclosed sintering paste comprises solvent and a powder of nanomicrocrystallite (NMC) particles. Each NMC particle is a single crystalline having at least one dimension in the range of 1 nm to 100 nm and at least one dimension in the range of 0.1 µm to 1000 µm. By utilizing crystallite particles having at least one dimension in the nanometer size range and at least one dimension in the micrometer size range, the disclosed sintering paste provides the particle size needed to provide the driving force for pressureless sintering while reducing the amount of stabilizer coating required to maintain the stability of the NMC particles during storage. Additionally, the reduction in stabilizer coating may ensure the stabilizer's complete evaporation as the NMC particles are heated to a sintering temperature. In particular embodiments, the NMC particles have a highly ordered, crystallite atomic structure having one dimension in the range of 1 nm to 100 nm and two dimensions in the range of 0.1 µm to 1000 µm.

Figure 1:
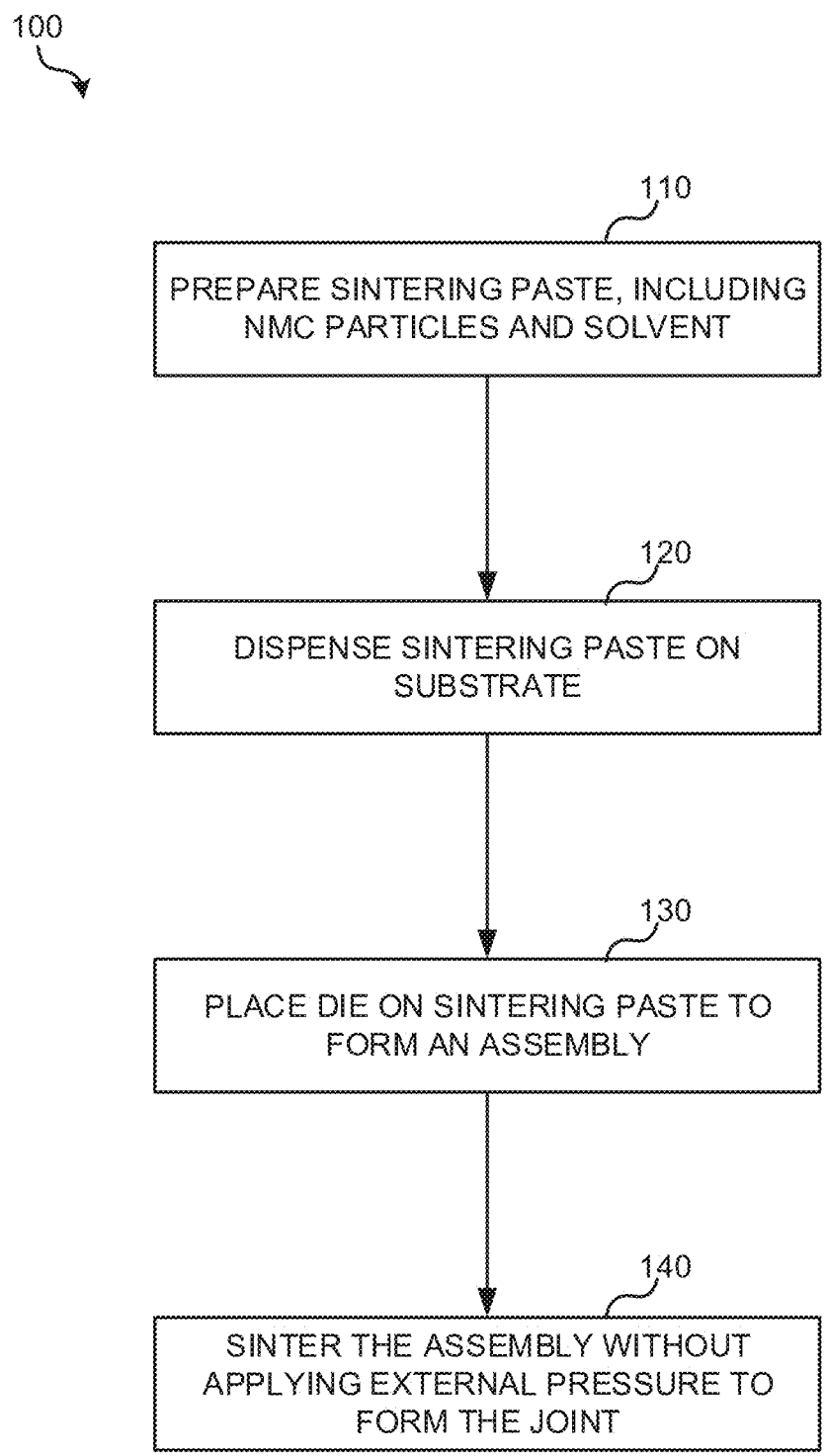
FIG. 1 is an operational flow diagram illustrating an example sintering process implemented using the NMC sintering paste disclosed herein.

FIG. 1 is an operational flow diagram illustrating an example sintering process 100 that may be implemented using the NMC sintering paste disclosed herein. At operation 110, a sintering paste including NMC particles is prepared. In embodiments, the sintering paste may be prepared by mixing a powder of NMC particles with a solvent. The solvent may be a polyglycol solvent or other suitable sintering solvent. In embodiments, the NMC particle powder may make up from 70 wt % to 95 wt % of the sintering paste, with the remainder being the solvent.

As noted above, each NMC particle is a single crystalline having at least one dimension in the range of 1 nm to 100 nm and at least one dimension in the range of 0.1 µm to 1000 µm. In particular embodiments, the NMC particles have one dimension in the range of 1 nm to 100 nm and two dimensions in the range of 0.1 µm to 1000 µm. The NMC particles of the powder are generally coated with a stabilizer (e.g., stearic acid) to maintain their stability during storage.

In embodiments, the NMC particles may be a noble metal, such as, for example, Au, Ag, Cu, Pt, Pd, Rh, Ir, Ru or Os. In some implementations, the NMC particles may comprise a combination two or more noble metals. The NMC particles may have different particle aspect ratios and sizes. For example, the NMC particles may comprise single crystalline Ag particles having different aspect ratios and sizes. As another example, the NMC particles may comprise multiple noble metal particles having different aspect ratios and sizes. In yet further embodiments, the NMC particles may comprise non-metals.

Following preparation of the sintering paste, at operation 120 the sintering paste is placed on a substrate. For example, the sintering paste may be placed on a direct bonded copper (DBC) substrate including a ceramic tile and a sheet of copper bonded on one or both sides. In one implementation, the sintering paste is stencil printed on the substrate.

At operation 130, a die or wafer containing an integrated circuit is placed on the sintering paste, thereby forming an assembly in preparation for sintering. For example, a Si or GaAs die containing a printed circuit board may be placed on the sintering paste using a pick and place machine.

At operation 140, the assembly is sintered without applying external pressure, thereby forming a joint between the die and substrate. During sintering operation 140, the assembly is heated (e.g., using an oven or heating plates) to a sintering temperature below the melting point of the NMC particles (e.g., 250° C.). As the assembly heats up, the particle stabilizer and the solvent evaporate, and the NMC particles may sinter. The assembly is heated for a suitable time (e.g., following a predetermined sintering temperature profile) and subsequently cooled down.

Before describing experimental results illustrating the improved properties of joints formed using the NMC sintering paste described herein, it is instructive to describe the benefits of using the NMC particles disclosed herein in a pressureless sintering process.

In a sintering process that does not use polymeric binder, the sintering particles (e.g., metal particles) form the joint. At low sintering temperatures, the Mackenzie-Shuttleworth Sintering Model states that the sintering driving force F is proportional to Expression (1):

$$\gamma/r + P_{applied} \qquad (1)$$

Where $\gamma$ is the surface energy, r is particle radius, and $P_{applied}$ is an external pressure that is applied. When an external pressure is applied, sintering may be accomplished even with particles having a radius in the micrometer range. The higher the pressure applied, the higher the sintering driving force is. On the other hand, when no external pressure is applied during a sintering process, the surface energy $\gamma$ needs to be very high, and the particle size needs to be very small.

Surface energy is the energy needed to generate new surface. The more stable the material is, the more difficult it will be to split the material to create new surface, hence the higher the surface energy will be. Due to its well-organized structure, crystalline material is considerably more stable than amorphous material, and therefore exhibits a much higher surface energy. For crystalline metal, single crystal exhibits no flaw or grain boundary, thus exhibit the highest organized structure, and consequently the highest surface energy.

As shown by Expression (1), when there is no external pressure, a particle with a nanometer-sized radius exhibits three orders of magnitude higher driving force than micrometer-sized particles. When considering the sintering driving force required for pressureless sintering, at least one of the three (XYZ) dimensions of the particle is preferably in the nm size. Eligible structures of particles that provide sufficient sintering driving force include $N^3$ structures (e.g., sphere), $N^2M$ structures (e.g., rod), and $NM^2$ structures (e.g., plate), where a dimension "N" refers to a size range from 1 nm to 100 nm, and a dimension "M" refers to a size range of 0.1 µm to 1000 µm.

However, a nanometer sized single crystallite or crystalline particle may be too reactive to remain stable at ambient temperature during storage. A material of this type may begin to sinter the moment it is synthesized, thus preventing it from becoming a practical, useful material for industry use. To maintain the stability of such nanometer sized crystalline particles, the particles are coated with a stabilizer that prevents contact between the particles, thus preventing sintering during ambient temperature storage. As temperatures rise during a sintering process, the stabilizer may evaporate, thus allowing the reestablishment of contact between particles and the subsequent sintering reaction. Where stabilizer is used, it is desirable to minimize stabilizer quantity to ensure complete evaporation before sintering. This quantity may be reduced by reducing the volume ratio of the coating to the particle.

Figure 2:
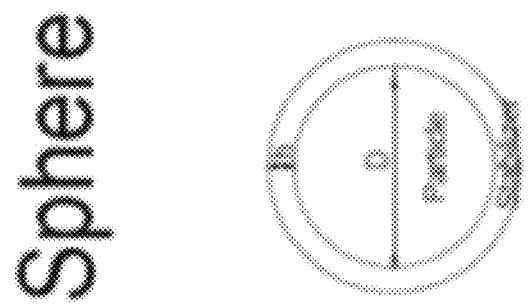
FIG. 2 Illustrates three different particle shapes (i.e., sphere, rod, and plate) having a particle diameter or thickness D, and coated with a stabilizer having a thickness h.
Figure 2:
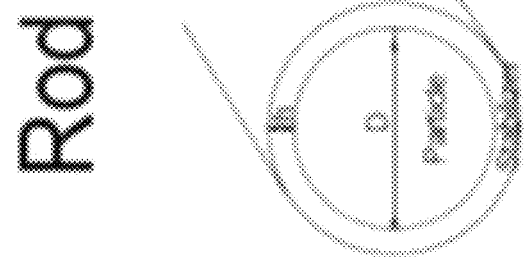
Figure 2:
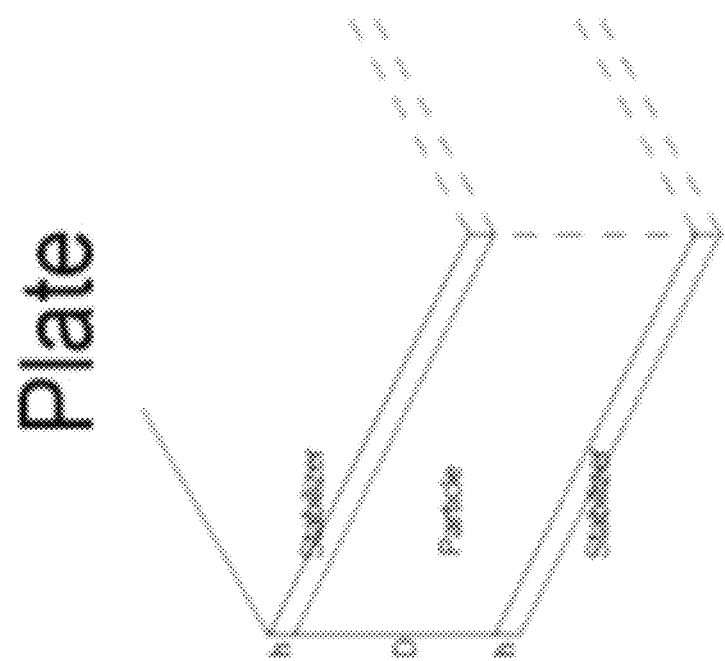

FIG. 2. Illustrates three different particle shapes (i.e., sphere, rod, and plate) having a particle diameter or thickness D, and coated with a stabilizer having a thickness h. The volume ratio R of stabilizer coating to particle may be a strong function of the size and shape of the particle as shown in FIG. 1. For example, for the spherical particle of FIG. 2, the volume ratio R is described by Equation (2):

$$R = \frac{\frac{4}{3}\pi\left(h+\frac{D}{2}\right)^3}{\frac{4}{3}\pi\left(\frac{D}{2}\right)^3} - 1 = \left(\frac{2h}{D}+1\right)^3 - 1 \quad (2)$$

For the rod-shaped particle of FIG. 2, the volume ratio R is described by Equation (3):

$$R = \frac{\pi\left(h+\frac{D}{2}\right)^2}{\pi\left(\frac{D}{2}\right)^2} - 1 = \left(\frac{2h}{D}+1\right)^2 - 1 \quad (3)$$

For the plate-shaped particle of FIG. 2, the volume ratio R is described by Equation (4):

$$R = \frac{2h}{D} \quad (4)$$

Figure 3:
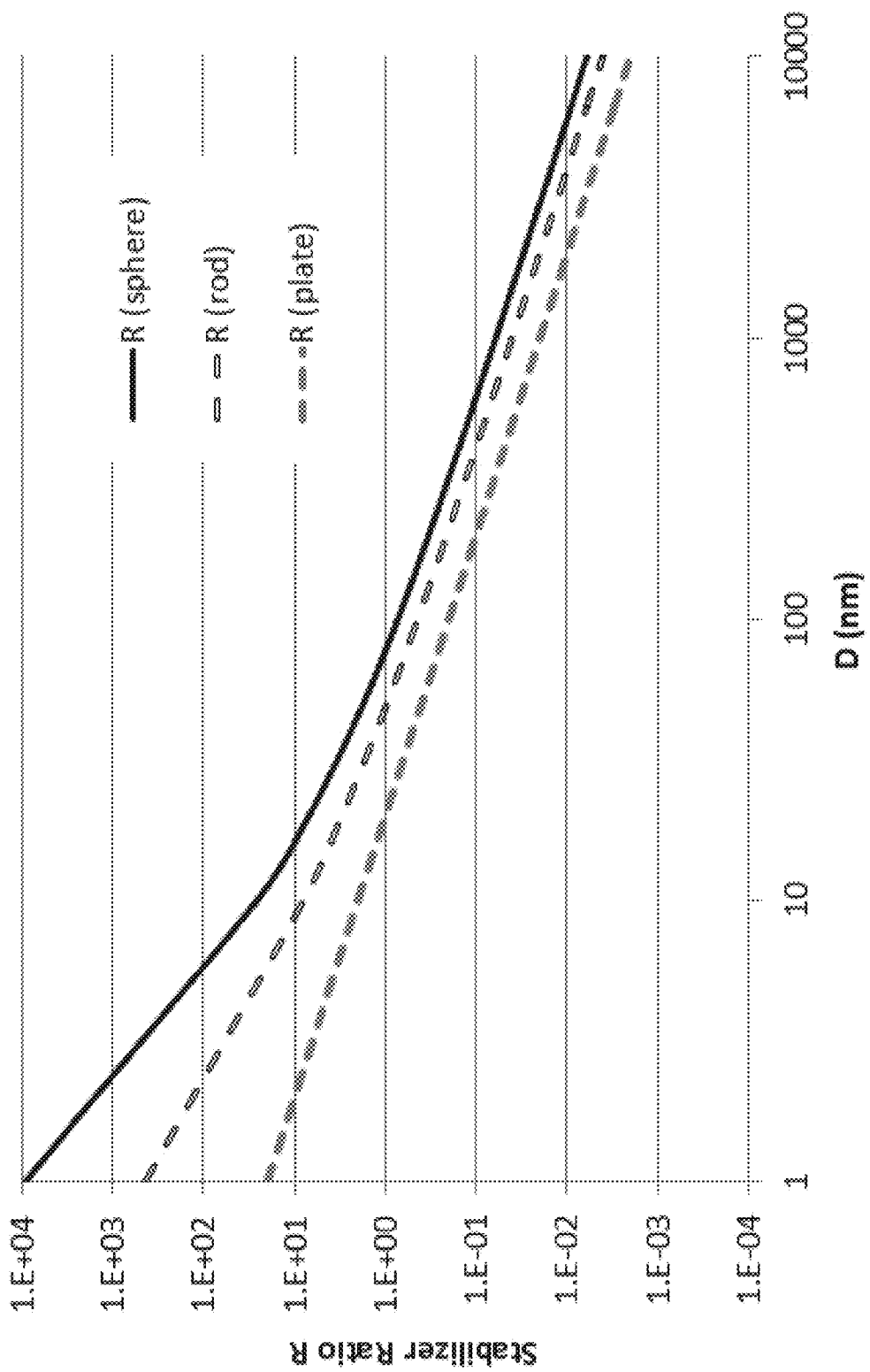
FIG. 3 is a plot illustrating the volume percentage of stabilizer coating as a function of particle diameter in spherical, rod-shaped, and plate-shaped particles.
Figure 4:
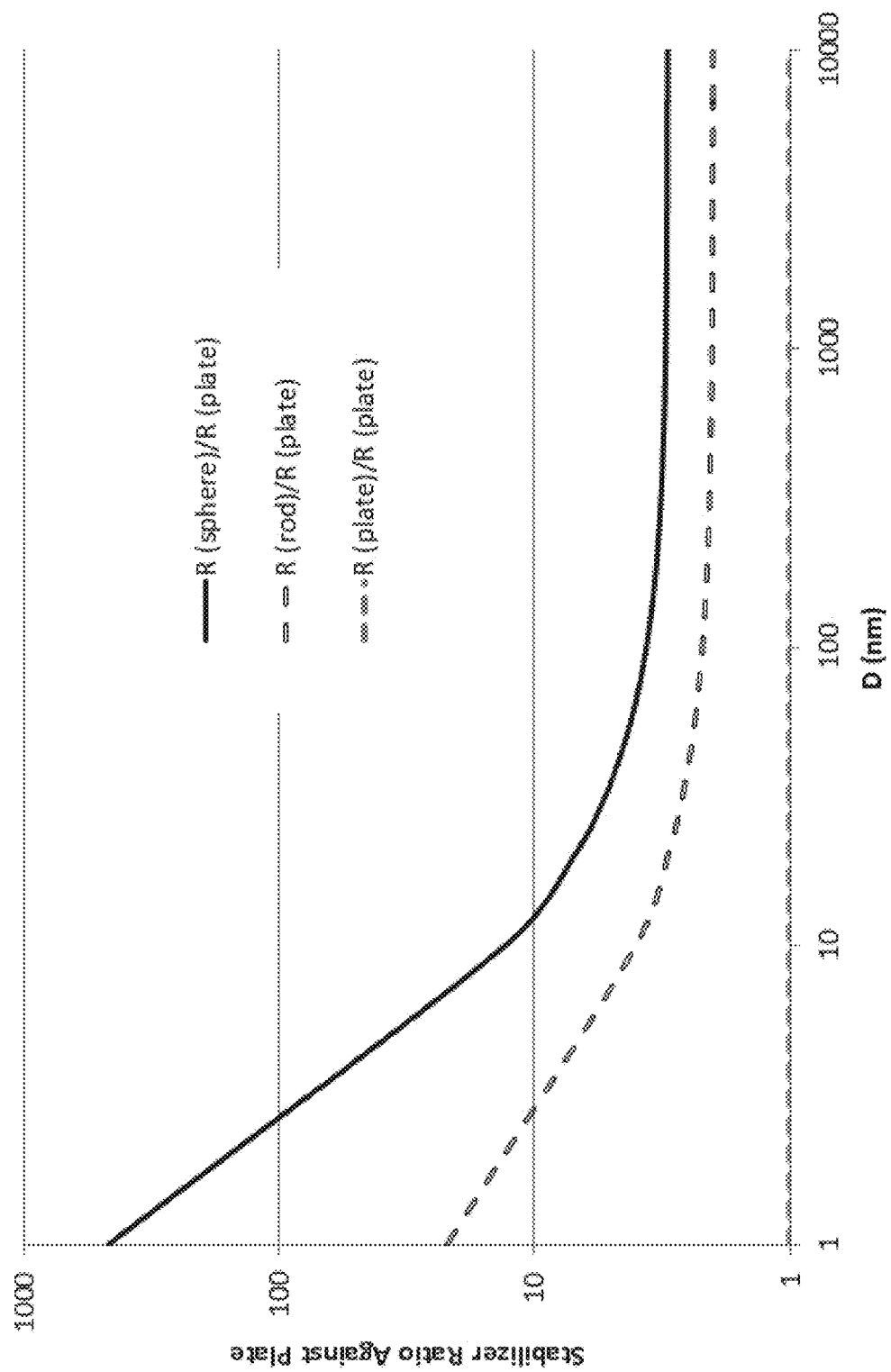
FIG. 4 is a plot illustrating the volume fraction of stabilizer coating against plate of a particle as a function of particle size, with a coating thickness of 10 nm.

As illustrated by Equations (2)-(4), the volume ratio of coating to particle decreases rapidly as the particle size increases from nanometers to millimeters, and decreases when the particle shape changes from spherical to rod to plate. For example, FIG. 3 is a plot illustrating the volume percentage of stabilizer coating as a function of particle diameter in spherical, rod-shaped, and plate-shaped particles. In the example of FIG. 3, the coating thickness h is 10 nm. As illustrated, the percentage of stabilizer decreases with increasing particle size. Additionally, the percentage of stabilizer is lowest for the plate-shaped particle and highest for the spherical particle. FIG. 3 is a plot illustrating the volume fraction of stabilizer coating against plate of a particle as a function of particle size, with a coating thickness of 10 nm. As shown, the difference between the plate-shaped particle and spherical and rod-shaped particles is most pronounced at smaller (i.e., nanometer) particle sizes.

As noted above, with nanometer sized single crystallites being preferred for pressureless sintering, the effect of particle shape may be important for suppressing the stabilizer coating volume fraction. For example, at a particle diameter of 100 nm, the relative coating volume of the spherical, rod-shaped, and plate-shaped particles is 3.64, 2.2, and 1 respectively. At a particle diameter of 10 nm, the relative coating volume of the spherical, rod-shaped, and plate-shaped particles is 13, 4, and 1 respectively. As these examples illustrate, a plate-shaped nanoparticle may be preferable to facilitate stabilizer evaporation.

Another important consideration during pressureless sintering is forming a joint having a low porosity. To lower the joint porosity, increasing packing efficiency of the particles can be important. The spherical, rod-shaped, and plate-shaped particles of FIG. 2 were considered in assessing packing efficiency. Table 1, below, shows the calculated minimal pore volume percentage of various mono-dispersed particle shapes and packing structures.

TABLE 1

Calculated minimal pore volume % of various mono-dispersed particle shapes and packing structures.

| Stacking Type | Pore Volume % |
| --- | --- |
| Plate | 0 |
| Rod-close packed | 9.3 |
| Rod-simple cubic | 21.5 |
| Sphere (face-centered cubic) | 25.2 |
| Sphere (body-centered cubic) | 32.0 |

For the rod-shaped particle, the length was considered infinite. For the plate-shaped particle, both the width and length were considered infinite. As shown, the sphere exhibits the lowest packing efficiency, followed by the rod, with the plate having the highest packing efficiency.

Table 2, below, is a summary of sintering particle properties that may achieve the desired sintering features, discussed above-namely, (i) high sintering driving force; (2) low stabilizer content; and (3) low porosity based on high packing efficiency.

TABLE 2

Sintering particle properties for achieving pressureless sintering, with reasonable material storage life, and low porosity after sintering.

| Features | Eligible Shape | Eligible XYZ dimensions | Eligible material nature |
| --- | --- | --- | --- |
| High sintering driving force | Very small | $NM^2$, $N^2M$, $N^3$ | Single crystallite |
| Low stabilizer content | Plate or block | $NM^2$, $M^3$ | Open |
| Low porosity based on high packing efficiency | Plate or block | $NM^2$, $M^3$ | Open |
| Overall properties which meet all 3 critical features desired | Small Plate | $NM^2$ | Single crystallite |

As illustrated, a small plate structure with dimension $NM^2$, and single crystallite in nature, may best be suited for pressureless sintering, with reasonable material storage life, and low porosity after sintering. For example, if the particle shape is not $NM^2$, the stabilizer content may be too high, and sintering may be hampered due to a large stabilizer barrier. As another example, if the particle does not include at least one N dimension or is not single crystallite, it may not sinter without external pressure.

EXAMPLES

Pressureless sintering experiments were conducted on embodiments of the NMC sintering paste disclosed herein. A die was bonded to a direct bonded copper (DBC) substrate using silver sintering pastes containing NMC particles. The size of the Si die was 3 mm×3 mm with titanium nickel silver as backside metallization. The size of the DBC was 23.5 mm×23.5 mm with a ceramic thickness of 0.38 mm and a copper (Cu) thickness of 0.2 mm on both sides. The metallization layer on copper was nickel gold. Sintering pastes with other types of particles were also tested for comparison.

Figure 5:
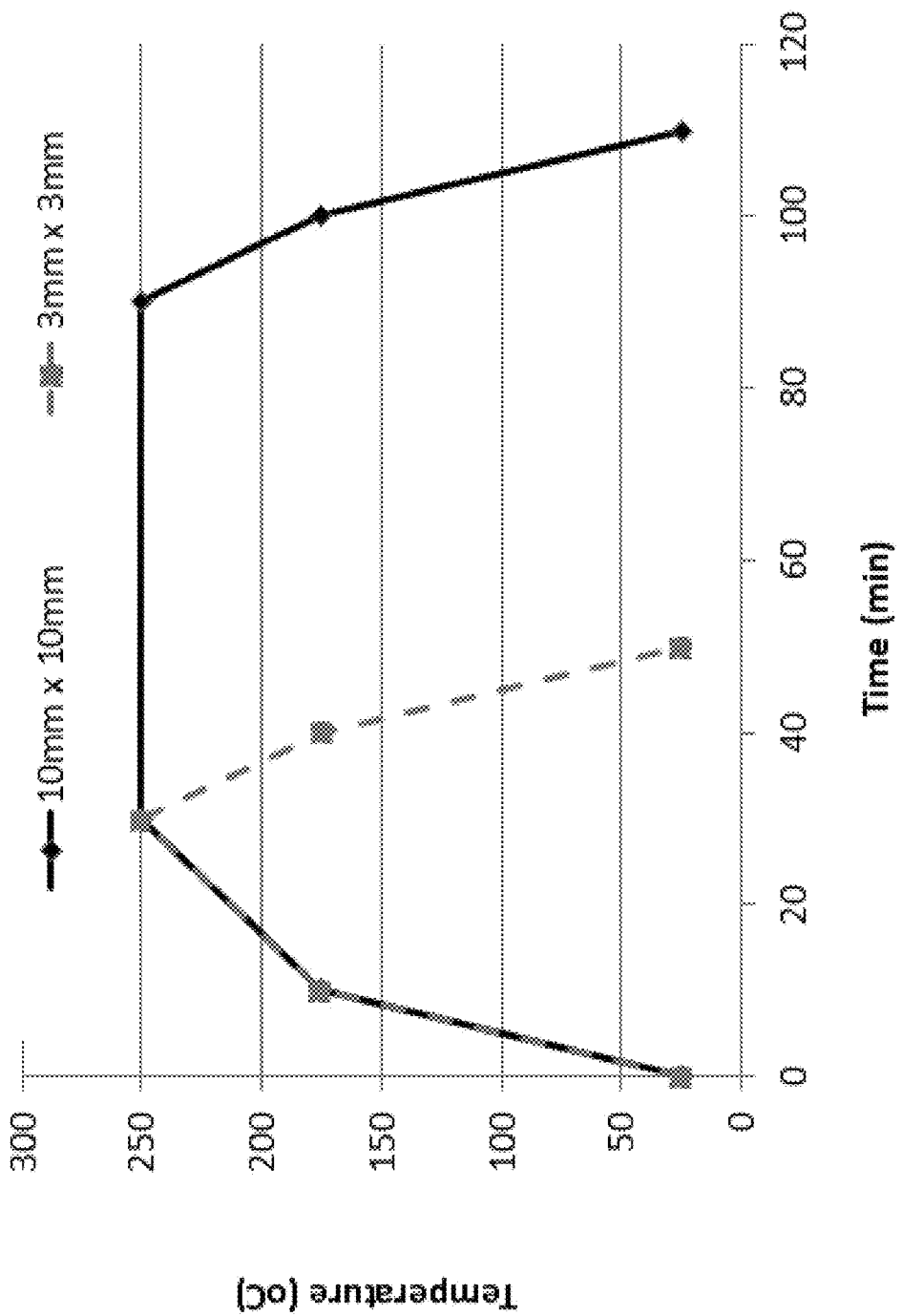
FIG. 5 illustrates example temperature profile plots for 3 mm×3 mm and 10 mm×10 mm dies that may be used in a sintering process.

During testing, each of the tested sintering pastes was stencil printed on the DBC substrate. The die was then placed on top of the paste using a pick and place machine to form an assembly. The assembly was then sintered under air atmosphere pressure (i.e., without applying external pressure) to form a sintered joint. During sintering, the temperature profile included heating from room temperature to 250° C. for several minutes and then cooling down to room temperature. While experiments were conducted on a 3 mm×3 mm die, it should be noted that varying the temperature profile with die size may be beneficial. For instance, as illustrated by the temperature profile plots of FIG. 5, the desired temperature profile for the 3 mm×3 mm die and 10 mm×10 mm die may differ. For the 10 mm×10 mm die, holding the heating time at 250° C. for about one hour can be beneficial for the sintered joint quality.

Thermal aging tests were carried out for joint reliability studies. The attached die was subjected to a 250° C. aging treatment for a series of pre-specified times prior to further testing.

Shear tests were conducted with a XYZTEC condor 250 shear tester. After thermal aging or thermal shock treatment, the die was tested for shear strength at an ambient temperature. In some cases, the die was sheared at various temperatures up to 300° C. to determine the maximum service temperature. After the shear test, the parts were examined by optical microscopy and scanning electron microscopy (SEM) for fracture morphology, and were further cross-sectioned for microstructure analysis via SEM and energy dispersive spectroscopy (EDS). As a control, some of the samples were cross-sectioned without running the shear test.

Electrical resistivity was measured using a Biddle micro-ohm meter and Alessi four probe testers. Test samples were prepared by stencil printing a line with 2 mm×50 mm×0.075 mm on a glass slide or ceramic coupon surface, then treating the samples with the same thermal profile as standard sintering process. The section area of the line was obtained by cross-section in order to accurately estimate the area.

Thermal conductivity was measured using a laser-flash machine. The samples were prepared by making a silver disc obtained by sintering with the standard temperature profile. The surface of the samples was grinded and polished to obtain a final disc with a size of 0.6 mm thickness and 12.5 mm diameter. At least three samples were measured for each result.

Example 1

A sintered joint formed using a sintering paste formulated with NMC particles was compared with joints formed using three sintering pastes formulated with $N^3$ nanoparticles of sizes 20, 60 and 100 nm. During preparation, it was noticed that more solvent (butyl carbitol) was needed to form a printable paste using the $N^3$ nanoparticle samples as compared to that of the NMC sample. The shear strength (Mpa), thermal conductivity (W/mK), and electrical resistivity ($\mu\Omega$·cm) of the formed joints was compared. The results are shown in Table 3, below.

TABLE 3

Effect of different shaped sintering particles on the shear strength, thermal conductivity and electrical resistivity of sintered joints.

| | NMC | NP-100 | NP-200 | SP-100 |
|---|---|---|---|---|
| particle shape | plate | sphere | sphere | sphere |
| particle size (nm) | 40 × 290 | 20 | 60 | 100 |
| Powder (wt %) | 92.6 | 85.8 | 85.8 | 80.6 |
| Butyl carbitol (wt %) | 7.4 | 14.2 | 14.2 | 19.4 |
| Shear strength (Mpa) | 31.78 | 5.09 | 2.31 | 1.54 |
| Thermal conductivity (W/mK) | 218 | 85 | 24 | 20 |
| Electrical resistivity ($\mu\Omega$ · cm) | 5 | 14 | 50 | 57 |

The joint strength of the NMC joint reached 31.78 Mpa, whereas the strengths of the $N^3$ joints were normally equal or smaller than 5 Mpa. Thermal conductivity of the NMC joint reached 218 W/mK, while that of the $N^3$ nanoparticle joints were within the range between 20 and 85 W/mK. The electrical resistivity of the NMC joint was 5 $\mu\Omega$·cm, which is about 3 times the bulk silver value, whereas that of the $N^3$ nanoparticle joints was in the range of 14 to 57 $\mu\Omega$·cm. As illustrated, the quality of the sintered joint formed using the NMC sintering paste is much higher, presumably due to the better sintering between particles.

Example 2

Figure 6:
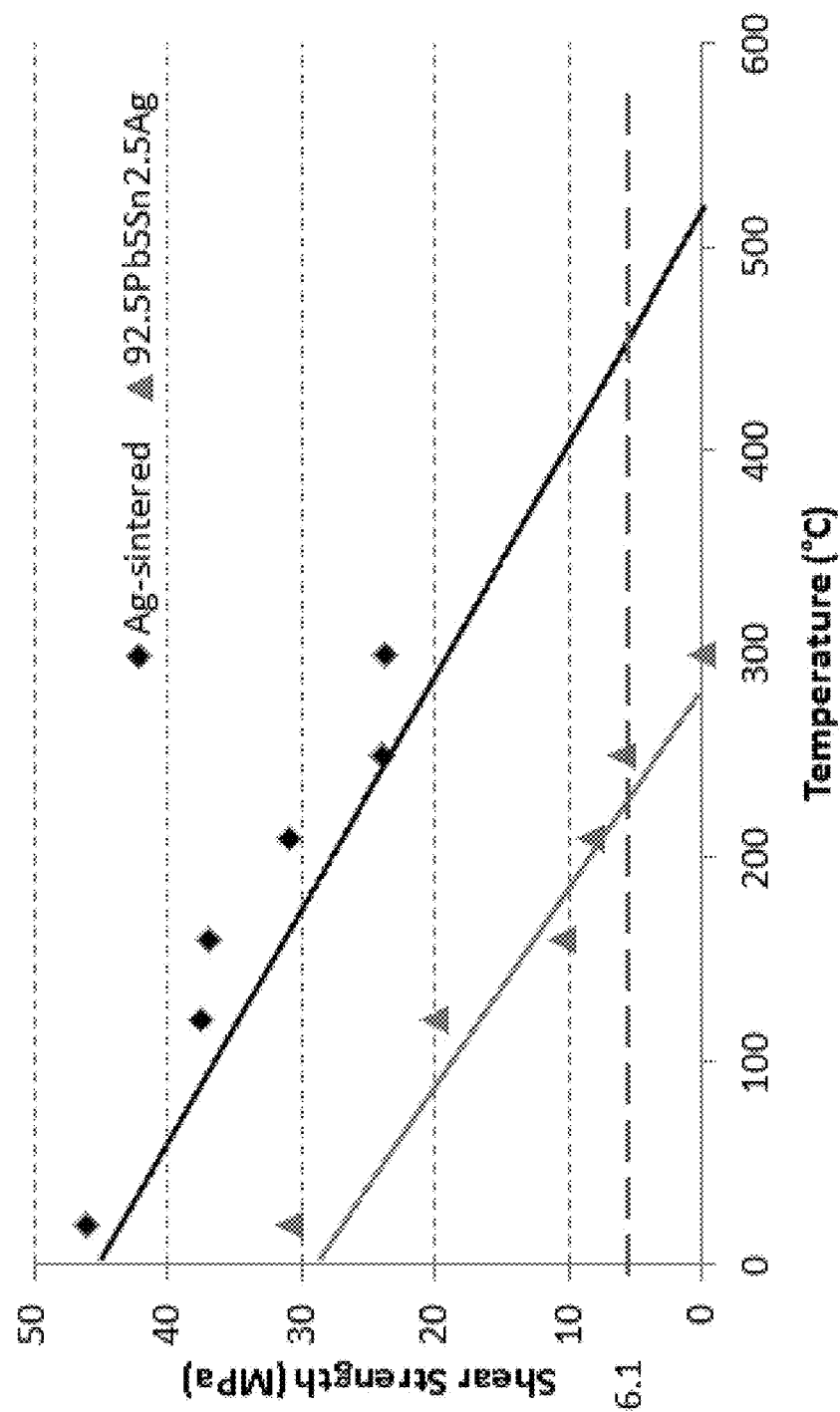
FIG. 6 is a plot illustrating the relationship between the shear strength and temperature for a joint formed using an NMC Ag-sintered paste versus a joint formed using a high Pb solder paste

In order to test the high temperature performance of the NMC sintering paste disclosed herein, experiments were conducted by comparing the shear strength of joints formed by NMC sintering pastes with the shear strength of joints formed by high Pb solder pastes. FIG. 6 is a plot illustrating the relationship between the shear strength and temperature for a joint formed using an NMC Ag-sintered paste versus a joint formed using a high Pb solder paste. In general, the joints formed using the NMC sintering paste showed higher shear strength than the joints formed using the high Pb solder alloy.

The service temperature of the joints was determined by running shear tests up to 300° C. By using 6.1 MPa die shear strength as a passing criteria, for high-Pb solder joints, of which the melting temperature range is 287-296° C., the maximum service temperature was found to be about 230° C. On the other hand, the Ag-sintered joints exhibited very high shear strength at least up to 300° C., and the extrapolated shear strength indicated a maximum service temperature of 470° C.

Example 3

Figure 7:
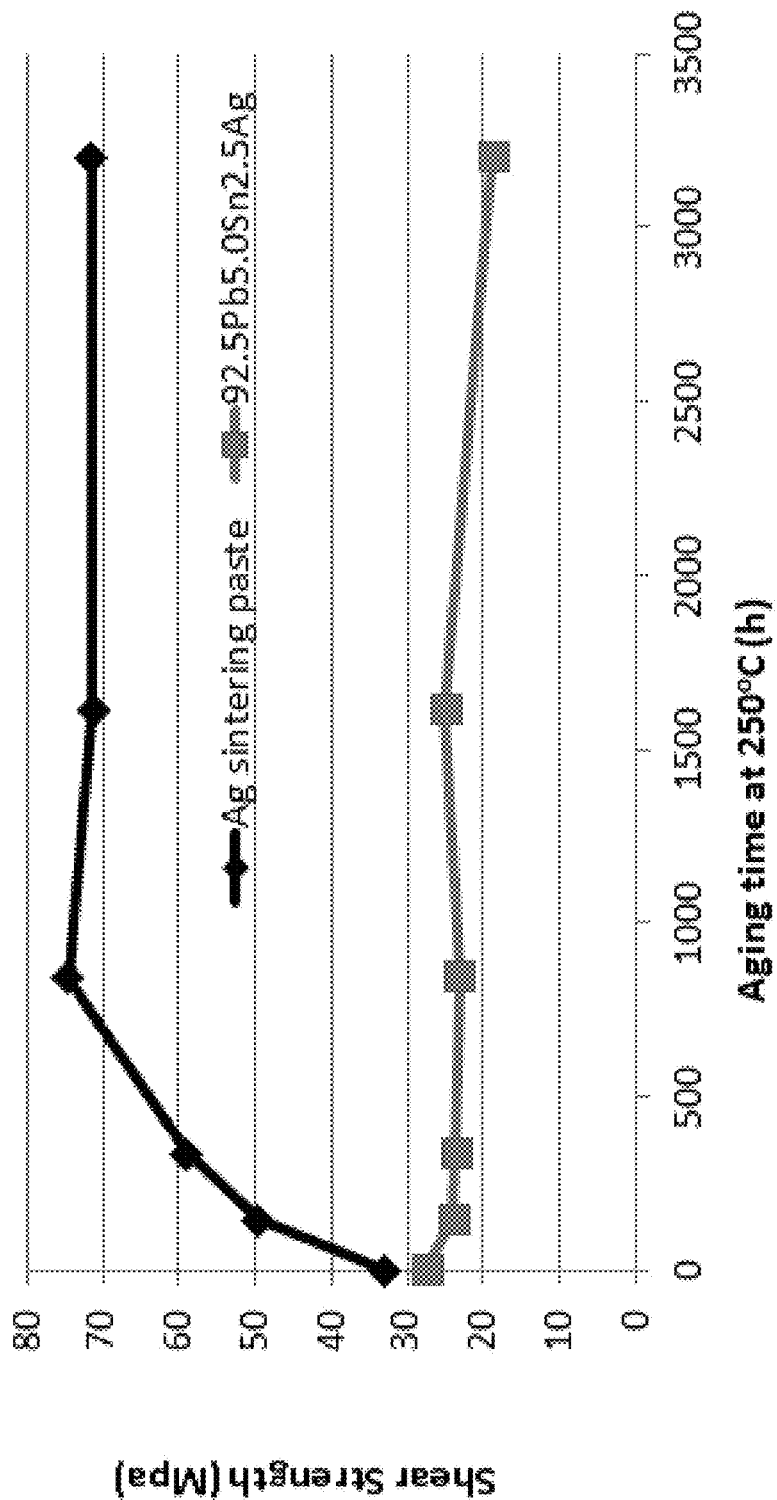
FIG. 7 is a plot illustrating the relationship between shear strength and aging time at 250° C. of joints formed by an Ag NMC sintering paste and joints formed by a high Pb solder paste.

In order to test the high temperature performance of the NMC sintering paste disclosed herein, thermal aging experiments were conducted at 250° C. using the high-PB solder as a reference. FIG. 7 is a plot illustrating the relationship between shear strength and aging time at 250° C. of joints formed by an Ag NMC sintering paste and joints formed by a high Pb solder paste. The NMC joint displayed strength and stability considerably higher than that of the high-Pb control.

The strength of the NMC joint increased continuously with increasing aging time up to about 800 hours, presumably due to continuous sintering at the aging temperature. The joint strength then stayed fairly constant with further aging up to 3200 hours. The thermal aging test illustrates that the NMC joint is very stable at 250° C. By contrast, the shear strength of high-Pb joints showed a moderate decline in strength after 1600 hours.

Example 4

Figure 8:
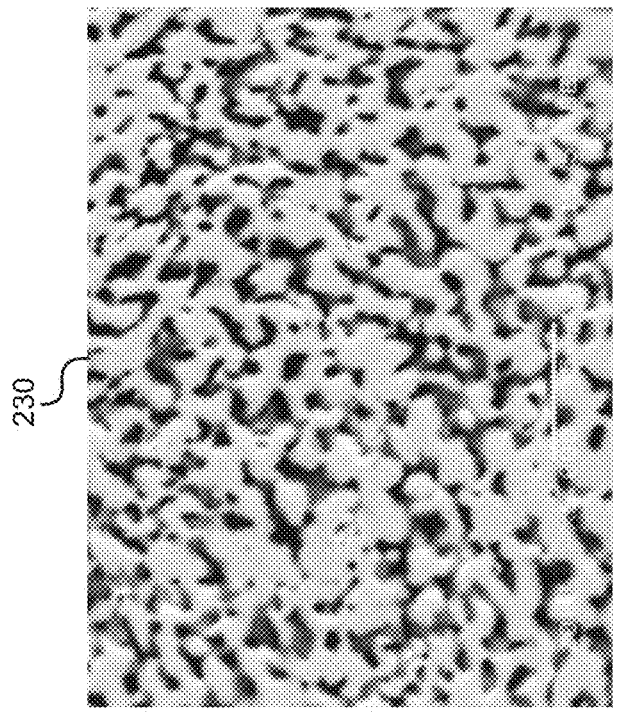
FIG. 8 includes SEM images of a cross-section of a joint formed using 100% NMC sintering particles and a cross-section of a joint formed using 50% NMC sintering particles and 50% spherical 3 µm silver sintering particles.
Figure 8:
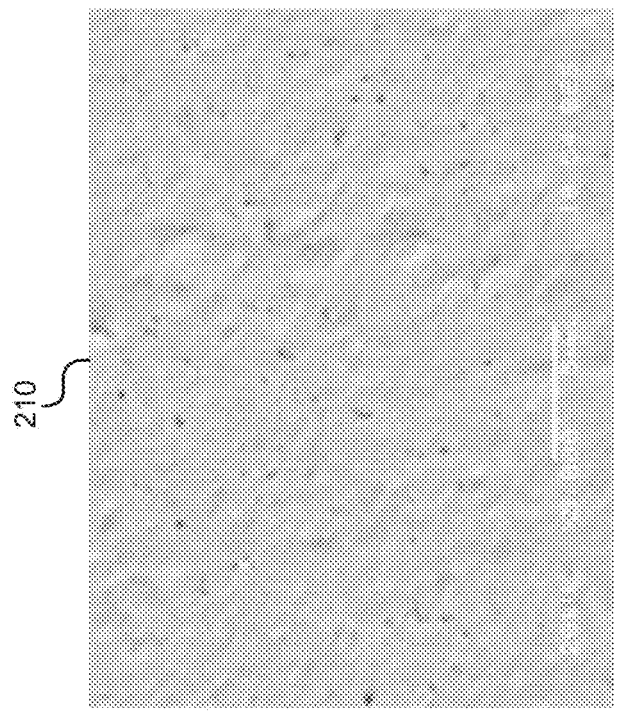

As mentioned above, the NMC sintering particles may reduce the porosity of the formed joint (e.g., when sintering widens the neck between particles). This was observed during aging of the thermally aged samples. FIG. 8 includes SEM images of a cross-section of a joint formed using 100% NMC sintering particles (SEM image 210) and a cross-section of a joint formed using 50% NMC sintering particles and 50% spherical 3 μm silver sintering particles (SEM image 230). The illustrated joints were formed by thermal aging at 250° C. for 16 h. The 100% NMC joint (SEM image 210) has a low porosity of less than 5%, demonstrating the ability of the NMC particles to reduce voids. By contrast, the other joint (SEM image 230) has a much higher porosity.

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

The invention claimed is:

1. A sintering paste, comprising:
   a nanomicrocrystallite powder comprising a plurality of nanomicrocrystallite particles, wherein each of the plurality of nanomicrocrystallite particles are single crystallites having one dimension in the range of 1 nm to 100 nm and two dimensions in the range of 0.1 μm to 1000 μm; and
   a solvent.

2. The sintering paste of claim 1, wherein the plurality of nanomicrocrystallite particles comprise at least one of Au, Ag, Cu, Pt, Pd, Rh, Ir, Ru and Os.

3. The sintering paste of claim 2, wherein the plurality of nanomicrocrystallite particles comprise at least two of Au, Ag, Cu, Pt, Pd, Rh, Ir, Ru and Os.

4. The sintering paste of claim 1, wherein the plurality of nanomicrocrystallite particles comprise particles having different aspect ratios and sizes.

5. The sintering paste of claim 1, wherein each of the plurality of nanomicrocrystallite particles are plate-shaped.

6. The sintering paste of claim 5, wherein each of the plurality of nanomicrocrystallite particles are coated with a stabilizer.

7. A method of making a sintering paste, comprising combining:
   a nanomicrocrystallite powder comprising a plurality of nanomicrocrystallite particles, wherein each of the plurality of nanomicrocrystallite particles are single crystallites having last one dimension in the range of 1 nm to 100 nm and two dimensions in the range of 0.1 μm to 1000 μm; with
   a solvent.

8. The method of claim 7, wherein the plurality of nanomicrocrystallite particles comprise at least one of Au, Ag, Cu, Pt, Pd, Rh, Ir, Ru and Os.

9. The method of claim 8, wherein the plurality of nanomicrocrystallite particles comprise at least two of Au, Ag, Cu, Pt, Pd, Rh, Ir, Ru and Os.

10. The method of claim 7, wherein the plurality of nanomicrocrystallite particles comprise particles having different aspect ratios and sizes.

11. The method of claim 7, wherein each of the plurality of nanomicrocrystallite particles are plate-shaped.

12. A method of sintering, comprising:
    dispensing a sintering paste on a substrate, the sintering paste, comprising:
       a nanomicrocrystallite powder comprising a plurality of nanomicrocrystallite particles, wherein each of the plurality of nanomicrocrystallite particles are single crystallites having one dimension in the range of 1 nm to 100 nm and two dimensions in the range of 0.1 μm to 1000 μm; and
       a solvent;
    placing a device on the sintering paste to form an assembly; and sintering the assembly without applying external pressure to form a sintered joint.

13. The method of claim 12, wherein the sintered joint has a porosity of less than 5% by volume.

14. The method of claim 13, wherein each of the plurality of nanomicrocrystallite particles are plate-shaped.

15. The method of claim 12, wherein the sintered joint has a shear strength of greater than 30 Mpa at 150° C.

16. The method of claim 12, wherein a maximum service temperature of the sintered joint is greater than 300° C.

17. The method of claim 12, wherein the device is a die comprising a circuit board.

18. The method of claim 12, wherein the plurality of nanomicrocrystallite particles comprise at least one of Au, Ag, Cu, Pt, Pd, Rh, Ir, Ru and Os.

19. The method of claim 18, wherein the plurality of nanomicrocrystallite particles comprise Ag.

20. A sintered joint formed by a process, the process comprising:
    dispensing a sintering paste on a substrate, the sintering paste, comprising:
        a nanomicrocrystallite powder comprising a plurality of nanomicrocrystallite particles, wherein each of the plurality of nanomicrocrystallite particles are single crystallites having dimension in the range of 1 nm to 100 nm and two dimensions in the range of 0.1 μm to 1000 μm; and
        a solvent;
    placing a device on the sintering paste to form an assembly; and
    sintering the assembly without applying external pressure to form the sintered joint.

* * * * *